United States Patent
Carberry

(10) Patent No.: US 7,009,305 B2
(45) Date of Patent: Mar. 7, 2006

(54) METHODS AND APPARATUS FOR INTEGRATED CIRCUIT BALL BONDING USING STACKED BALL BUMPS

(75) Inventor: Patrick J. Carberry, Laurys Station, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/881,191

(22) Filed: Jun. 30, 2004

(65) Prior Publication Data

US 2006/0001157 A1    Jan. 5, 2006

(51) Int. Cl.
*H01L 23/48* (2006.01)
*H01L 23/52* (2006.01)

(52) U.S. Cl. .................... 257/780; 438/613
(58) Field of Classification Search ............... 257/780, 257/781, 784, 756; 438/613, 614
See application file for complete search history.

(56) References Cited

U.S. PATENT DOCUMENTS

| | | | |
|---|---|---|---|
| 5,186,381 A * | 2/1993 | Kim | 228/123.1 |
| 5,976,964 A * | 11/1999 | Ball | 438/613 |
| 6,165,887 A | 12/2000 | Ball | |
| 6,380,635 B1 * | 4/2002 | Manning et al. | 257/784 |
| 6,499,648 B1 | 12/2002 | Shich et al. | |
| 6,561,411 B1 * | 5/2003 | Lee | 228/180.5 |
| 6,624,059 B1 * | 9/2003 | Ball | 438/612 |
| 6,863,208 B1 * | 3/2005 | Lee | 228/180.5 |
| 6,876,077 B1 * | 4/2005 | Murata et al. | 257/738 |
| 2001/0026021 A1 * | 10/2001 | Honda | 257/778 |
| 2002/0158325 A1 * | 10/2002 | Yano et al. | 257/686 |
| 2003/0205725 A1 * | 11/2003 | Masumoto et al. | 257/200 |

* cited by examiner

Primary Examiner—S. V. Clark

(57) ABSTRACT

An integrated circuit comprises at least one circuit element having at least one bond site and a passivation layer. The bond site is accessible through an aperture in the passivation layer. At least two ball bumps are disposed at the bond site. A first ball bump is bonded to the bond site, and each additional ball bump is bonded on a previously bonded ball bump so that the height of the ball bumps is greater than the thickness of the passivation layer above the bond site. A ball bond is bonded to an uppermost ball bump and has a wire formed integrally therewith.

22 Claims, 3 Drawing Sheets

METHODS AND APPARATUS FOR INTEGRATED CIRCUIT BALL BONDING USING STACKED BALL BUMPS

FIELD OF THE INVENTION

The present invention relates generally to the field of integrated circuits and, more particularly, to bonding operations performed on an integrated circuit.

BACKGROUND OF THE INVENTION

An integrated circuit, such as a radio frequency (RF) integrated circuit, may include multiple transistor dies that are placed in an integrated circuit package by a die attach machine. A robotic bonding tool may then be used to wire bond the dies to other circuit elements within the package, and to leads of a package leadframe. Such a tool generally includes a surface that detects bond pads or other bond sites of a given die, and determines the height coordinates of these bond pads. The other circuit elements in an RF integrated circuit may include, for example, tuning capacitors.

The two major wire-bonding processes used for electronic package interconnects are wedge bonding and ball bonding. The wedge-bonding process has traditionally been used to form the package interconnects of RF integrated circuits due to its ease in forming the wire bond profiles necessary for optimal RF performance.

Ball bonding provides a more economical and robust process than that of wedge bonding. In ball bonding, a wire is fed through and protrudes from a hole in a bonding tool, commonly referred to as a capillary. An electric arc melts the protruding wire into a ball. The solid ball is pressed and bonded onto the bond site by the bonding head. The ball-contact surface interface is subjected to ultrasonic vibrations, a specified bond force, and heat, for a small amount of time to form a bond between the ball and the bond site. However, the inability of traditional ball bonders to perform ball-bonding operations without harsh terminations at a die surface has created an overwhelming bias against using modern ball-bonding processes for wire bonding RF integrated circuits.

Ball-bumping techniques of modern ball bonders lessen the harshness of wire bond terminations on a primary die and capacitors. A ball bump is a solder ball or stud that is typically placed on a bond site prior to bonding an interconnecting wire. In creating a ball bump, a ball formed in the bonding tool is plastically deformed and bonded to the bond site. Additional recent developments in commercially-available ball bonders include improvements such as the ability to perform two separate reverse motions, ball size reduction, and wire length control. However, the ball size associated with the ball bonder remains very large, requiring the use of larger bond sites. Since optimal RF performance often requires minimal bond site size, the ball sizes are also a factor in favoring the use of wedge bonding instead of ball bonding in the assembly of RF integrated circuits. Methods of ball bonding on previously made ball bumps on the bond sites of a semiconductor device have also been suggested. See, for example, U.S. Pat. Nos. 5,976,964, 6,165,887 and 6,624,059.

A standard ball bond on a smaller bond site may cause contact with a passivation layer and result in a cracked passivation layer and other possible die damage. The use of a thinner wire may decrease the size of the resulting ball bond for bonding purposes, allowing the ball bond to fit on the smaller bond site without contact with the passivation layer. Thinner wire also results in less harsh terminations during bonding. However, when the thinner wire is used to connect circuit elements of the integrated circuit, problems such as wire sweep, which is caused during molding when wires are pushed together, and weakened signal strength may result. Thus, a need remains for further improvements in ball-bonding techniques, particularly in RF integrated circuit applications.

SUMMARY OF THE INVENTION

The present invention in an illustrative embodiment provides techniques for ball bonding wires in an RF integrated circuit, in a manner that provides a robust connection for bond sites and ball bonds that would otherwise not be connectable due to the size of the ball bond compared to the smaller size of the bond site, while also minimizing contact with a passivation layer.

In accordance with one aspect of the invention, an integrated circuit is provided. The integrated circuit comprises at least one circuit element having at least one bond site and a passivation layer. The bond site is accessible through an aperture in the passivation layer. At least two ball bumps are disposed at the bond site. A first ball bump is bonded to the bond site, and each additional ball bump is bonded on a previously bonded ball bump so that the height of the ball bumps is greater than the thickness of the passivation layer above the bond site. A ball bond is bonded to an uppermost ball bump and has a wire formed integrally therewith.

In accordance with another aspect of the invention, a method for performing a wire bonding operation in an integrated circuit, utilizing a bonding tool, is provided. A first ball bump of at least two ball bumps is bonded to a bond site in the integrated circuit. Each additional ball bump of the at least two ball bumps is bonded on a previously bonded ball bump so that the height of the at least two ball bumps is greater than a thickness of a passivation layer above the bond site. A ball bond, having a wire integral therewith, is bonded to an uppermost ball bump.

Advantageously, an illustrative embodiment of the present invention produces bumped ball bonds, having multiple ball bumps, that provide the ability to connect bond sites and ball bonds that would otherwise not be connectable due to the size of the ball bond compared the smaller size of the bond site. The smaller bond site provides optimal RF performance and allows bond sites to be disposed closer to one another on the surface of the circuit element. The standard ball bond provides a more robust connection without causing damage to the smaller bond site, and decreases the chance of mold sweep and decreased signal strength when working with wire bonds. More specifically, a ball bump formed from smaller diameter wire is created on a smaller bond site and additional ball bumps formed from wires with larger or standard diameters are formed on top of the smaller ball bump and one another until a desired height is reached, which is higher than a height of the passivation layer above the bond site. This minimizes contact with the passivation layer with the goal of having no contact between the passivation layer and the ball bond. The number of ball bumps may also be affected by a requirement that the uppermost ball bump support a ball bond formed with a standard wire size.

These and other objects, features, and advantages of the present invention will become apparent from the following

DETAILED DESCRIPTION

As will be described in detail below, the present invention in the illustrative embodiment achieves a robust connection for bond sites and ball bonds that would otherwise not be connectable due to the size of the ball bond compared to the smaller size of the bond site, while also minimizing contact with the passivation layer and still allowing a wire having a standard diameter to be used for the ball bond.

Figure 1:
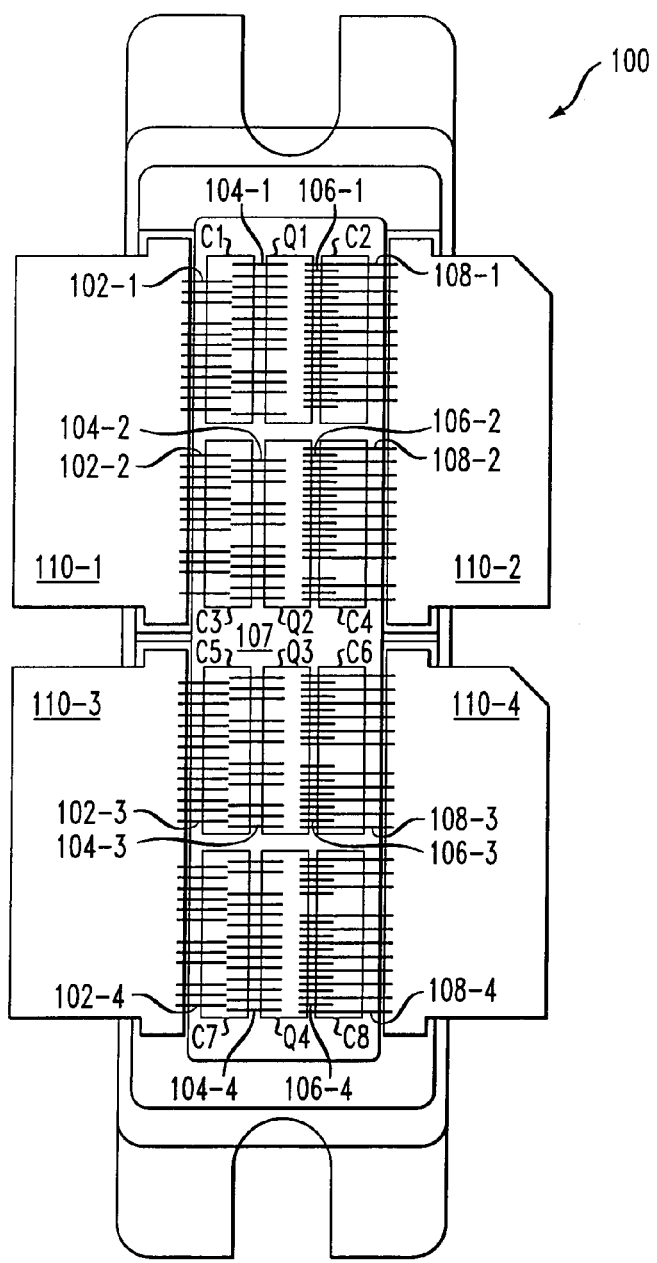
FIG. 1 is a diagram illustrating a top cut-away view of a packaged integrated circuit having wire bonds between RF power dies, input and output capacitors and gate and drain leads, according to an embodiment of the present invention.

Referring initially to FIG. 1, RF power dies Q1, Q2, Q3, Q4, are disposed in a packaged RF integrated circuit 100 on a substrate 107. Integrated circuit 100 is shown with an upper portion of the package removed so that the internal elements and wires are visible. FIG. 1 shows die Q1 disposed between capacitors C1, C2; die Q2 between capacitors C3, C4; die Q3 between capacitors C5, C6; and die Q4 between capacitors C7, C8. In this embodiment, dies Q1–Q4 are transistor dies and capacitors C1–C8 are input and output tuning capacitors of packaged RF integrated circuit 100. Dies Q1–Q4 and tuning capacitors C1–C8 are disposed within an integrated circuit package. The package comprises a leadframe having drain and gate leads illustrated by elements 110-1, 110-2, 110-3, 110-4.

As shown in the figure, a first set of wires 102-1 connects lead 110-1 to first tuning capacitor C1. Similarly, a second set of wires 104-1 connects first tuning capacitor C1 to die Q1, a third set of wires 106-1 connects die Q1 to second tuning capacitor C2, and a fourth set of wires 108-1 connects die Q1 to lead 110-2. These wire sets are repeated for each capacitor-die-capacitor arrangement. Wire sets 102-2, 104-2, 106-2, 108-2 provide connections for die Q2 and its associated capacitors C3 and C4. Wire sets 102-3, 104-3, 106-3, 108-3 provide connections for die Q3 and its associated capacitors C5 and C6. Wire sets 102-4, 104-4, 106-4, 108-4 provide connections for die Q4 and its associated capacitors C7 and C8.

Figure 2:
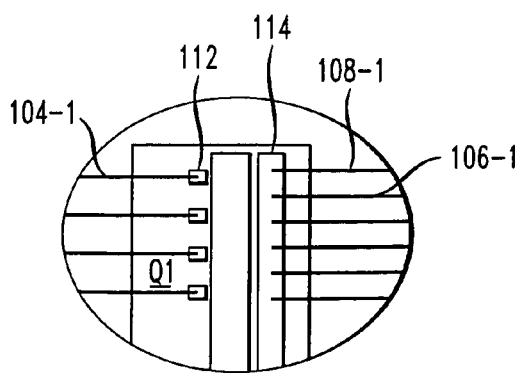
FIG. 2 is a diagram illustrating a magnified view of a portion of a die of the integrated circuit of FIG. 1, according to an embodiment of the present invention.

Referring now to FIG. 2, a more detailed view of a portion of die Q1 is shown, illustrating the set of wires 104-1 extending out from the left side of die Q1, and sets of wires 106-1 and 108-1 extending out from the right side of die Q1. In this embodiment, sets of wires 104-1 and 106-1 connect to tuning capacitors, while set of wires 108-1 connects to the integrated circuit package lead 110-2. Wires of the set 104-1 are individually bonded to die Q1 at individual bond pads 112. Sets of wires 106-1 and 108-1 are bonded to die Q1 at a bond strip 114.

Bond pads, bond strips or other types of bond sites can be utilized for each of the bonding areas on the dies, capacitors or leads. Therefore, while an embodiment of the present invention below is illustrated with a bond pad, other types of bond sites may also be utilized with the present invention as well.

Figure 3:
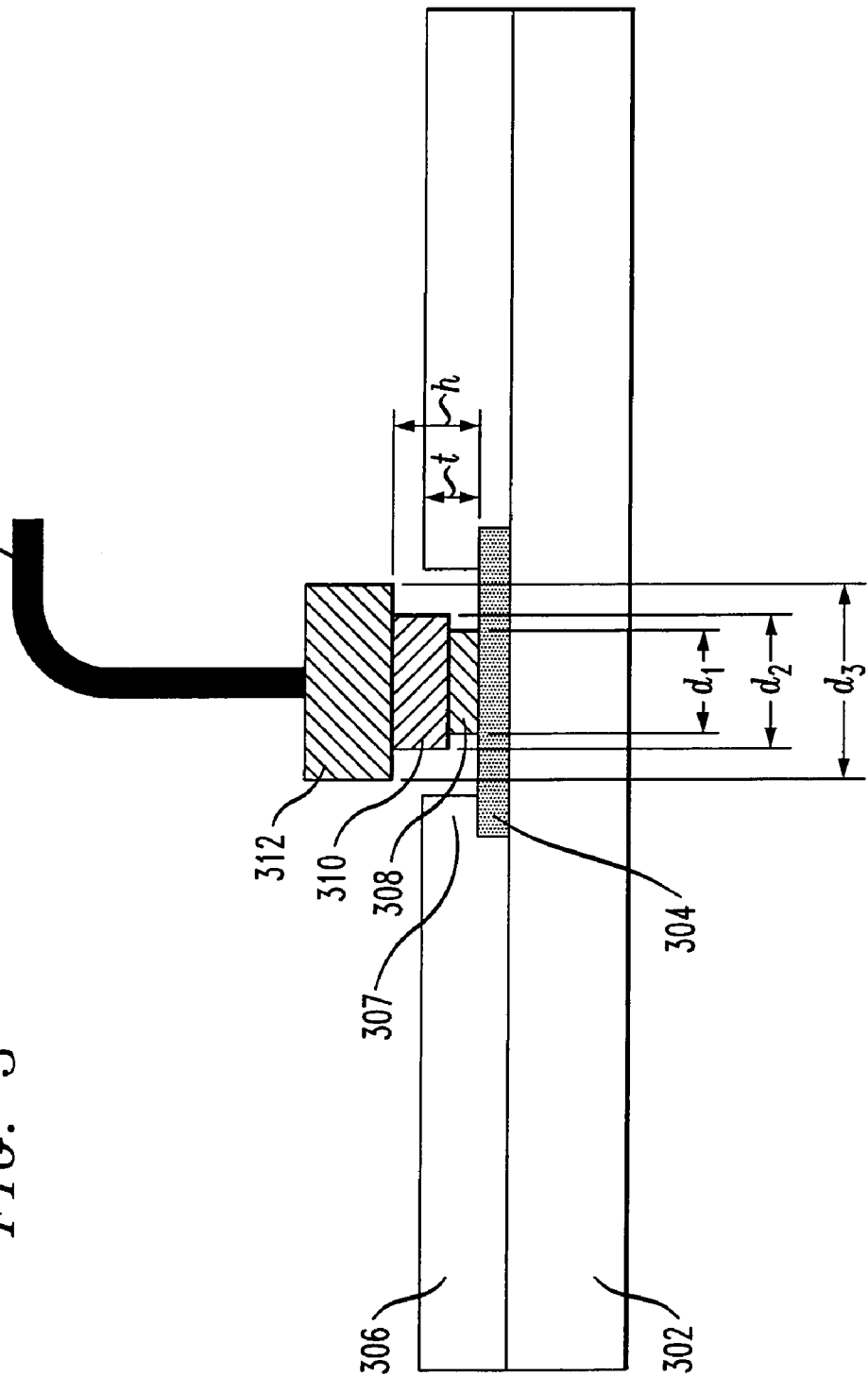
FIG. 3 is a diagram illustrating a cross-sectional view of a wire bond having multiple ball bumps at the bond pad, according to an embodiment of the present invention.

Referring now to FIG. 3, a diagram illustrates a magnified view of a wire bond having multiple ball bumps at a bond pad, according to an embodiment of the present invention. An RF power die, similar to dies Q1–Q4 may be disposed in an integrated circuit package as described in FIGS. 1 and 2. A bond pad 304 is disposed on the upper surface of an RF power die or other circuit element 302. A passivation layer 306, which may be formed of borosilicate, coats the surface of element 302. Passivation layer 306 has an aperture so that bond pad 304 is accessible from above for electrically connecting bond pad 304 to other circuit elements. Passivation layer 306 has similar apertures at additional bond pads of element 302. Passivation layer 306 partially extends over bond pad 304 in the form of an overlap 307.

A first ball bump 308, having a diameter $d_1$, is disposed on bond pad 304. Diameter $d_1$ is an example of what is referred to herein as a "widest" diameter. As described herein, a widest diameter is a diameter of a cross-section taken at a widest point of a ball bump or ball bond in a plane parallel to the surface of bond pad 304. A second ball bump 310, having a diameter $d_2$, is disposed directly on top of first ball bump 308. Diameter $d_2$ of second ball bump 310, also a widest diameter, is larger than diameter $d_1$ of first ball bump 308. The diameter of a ball bump at the bond pad is dependent on the diameter of the wire used in the capillary of the bonding tool to form the ball bump. For example, first and second ball bumps 308, 310 may be created with wires having diameters between approximately 12 and 50 microns. The standard wire diameter is 50 microns. The diameter of a ball bump formed from wire in a bonding tool may be approximately 1.2 times the wire diameter. Thus, ball bumps having diameters between approximately 14.4 and 60.0 microns are formed with wires having diameters between approximately 12 and 50 microns.

A ball bond 312 is disposed on second ball bump 310. In this embodiment of the present invention, ball bond 312 has a larger diameter $d_3$ than those of first and second ball bumps 308, 310, where $d_3$ is the widest diameter of ball bond 312. Also, according to this embodiment of the present invention, ball bond 312 is formed from wire 314. Wire 314 joins element 302 with another circuit element or a lead frame of the integrated circuit as shown in FIGS. 1 and 2. Typically, it is desirable in the art for a wire that joins circuit elements through wire bonding to have a diameter of at least approximately 50 microns. This wire diameter decreases the likelihood of wire sweep and weakened signal strength. Ball bumps 308 and 310, ball bond 312, and wire 314 are preferably formed of gold, but may also be formed of aluminum, copper or other materials.

Those individual balls bumps not part of wire 314, namely ball bumps 308 and 310, achieve a height h above bond pad 304. Height h is greater than a thickness t of passivation layer 306 above bond pad 304. Therefore, a smaller bond pad which typically was not able to connect with ball bond 312, is able to support such a connection through a series of smaller ball bumps that increase in widest diameter, and increase the height of the ball bond above passivation layer 306.

As shown in the illustrative embodiment of the present invention, ball bumps 308, 310 and ball bond 312 increase in diameter as the height above bond pad 304 increases. However, ball bumps 308, 310 and ball bond 312 may also vary in diameter so that a smaller diameter ball bump is bonded on top of a larger diameter ball bump or a smaller diameter ball bond 312 is bonded on top of a larger diameter ball bump 310. The number of ball bumps may also vary as the thickness of passivation layer 306 or the size of bond pad 304 requires. For example, an additional embodiment of the present invention may only require a single ball bump to achieve a height above bond pad 304 that is greater than the thickness of passivation layer 306 above bond pad 304. Further, while FIG. 3 illustrates ball bumps 308, 310 and ball bond 312 having substantially rectangular shapes, this is for simplicity and clarity of illustration, and not intended to be limiting in any way. For example, ball bumps 308, 310 and ball bond 312 may be plastically deformed from a round or semi-spherical shape into a pancake-like shape during the bonding process.

Figure 4:
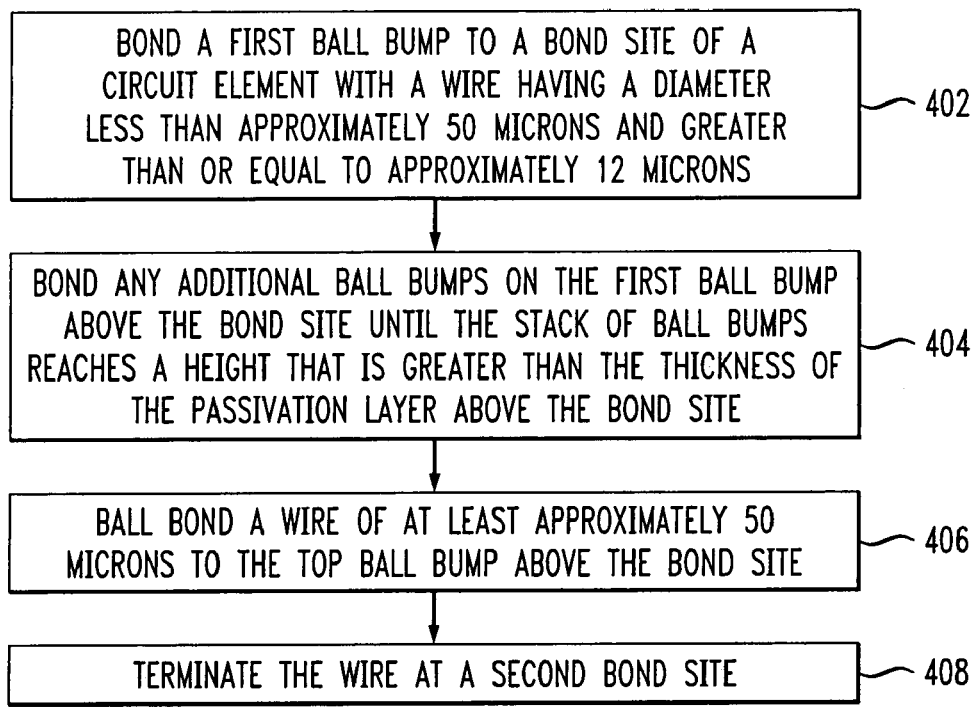
FIG. 4 is a flow diagram illustrating a ball bonding methodology, according to an embodiment of the present invention.

Referring now to FIG. 4, a flow diagram illustrates a bonding methodology according to an embodiment of the present invention. This exemplary methodology may be used to form the wire bonds shown in FIGS. 1–3. In block 402, a first ball bump is bonded to a bond site of an integrated circuit with a wire having a diameter of less than approximately 50 microns and greater than or equal to approximately 12 microns.

In bonding a ball bump, a ball is positioned over the center of the bond site and placed on the site by the capillary. The capillary then applies force and ultrasonic energy to bond the ball onto the bond site. During this bonding, the ball is plastically deformed and changes from a semi-spherical shape into a pancake-like shape. The diameter of the ball bump after bonding is at least 1.2 times, and up to 4 times, the diameter of the ball before bonding. A typical design goal is to keep the ball bump diameter to a minimum while maintaining the bond strength. As the ball bump diameter increases the ball bump height decreases. One reason for the typical flatness, or pancake-like shape, is to allow the wire to be broken off without leaving any wire protruding from the top of the ball bump. This allows for easier attachment of another wire bond, whether it be a ball or wedge bond.

In block 404 additional ball bumps are bonded on a previously bonded ball bump above the bond site. Additional ball bumps are bonded on previously bonded ball bumps until at least a portion of the uppermost ball bump of the stack of ball bumps reaches a height that is greater than the thickness of the passivation layer above the bond site. In the illustrative embodiment of the present invention, two ball bumps are necessary to achieve the desired height. Also, as shown in the illustrative embodiment, the additional ball bumps increase in widest diameter as the height above the bond site increases so that, in the case of wire bonding, a wire having a larger diameter may be used to connect circuit elements.

In block 406, a wire having a diameter of at least approximately 50 microns is ball bonded to the uppermost ball bump above the bond site of the circuit element, which is also above the passivation layer. In block 408, the wire of at least approximately 50 microns is terminated at a second bond site, thereby creating a wire bond profile. The ball-bonding operation may be repeated for additional wire bonds of the integrated circuit.

Figure 5:
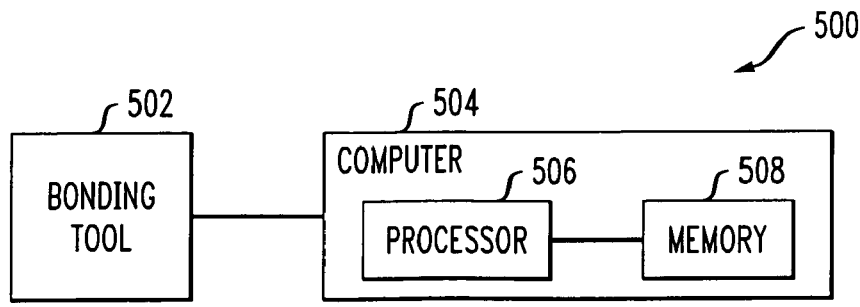
FIG. 5 is a block diagram illustrating an exemplary bonding system suitable for implementing a bonding technique, according to an embodiment of the present invention.

Referring now to FIG. 5, a block diagram illustrates an example of a bonding system 500 in which a wire-bonding technique of the invention may be implemented. As illustrated, system 500 comprises a bonding tool 502 coupled to a computer 504, which may comprise a processor 506 and a memory 508. One or more of the steps shown in FIG. 4 may be performed at least in part utilizing software executed by processor 506 and stored in memory 508.

Accordingly, as described herein, the present invention in the illustrative embodiment provides a robust connection for bond sites and ball bonds that would otherwise not be connectable due to the size of the ball bond compared to the smaller size of the bond site, while also minimizing contact with the passivation layer.

Additional embodiments of the present invention may incorporate various number and diameter combinations of ball bumps, wires of varying diameters for creation of the ball bumps, various passivation layer thicknesses and aperture sizes, as well as various bond site sizes. The invention may also incorporate various numbers and combinations of transistor dies, tuning capacitors, leads, or other circuit elements, arranged in various configurations within a given integrated circuit. The positioning and number of transistor dies, tuning capacitors and other elements will of course result in various numbers and configurations of wire bonds and associated bond sites. The techniques of the present invention may also be used in non-RF integrated circuits. Further, additional embodiments may incorporate various wire bond shapes, wire bond heights, wire diameters and other wire characteristics.

Regarding the various numbers and combinations of transistor dies, a plurality of identical die are typically formed in a repeated pattern on a surface of the wafer. Each die includes a device as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Therefore, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An integrated circuit comprising:
   at least one circuit element comprising at least one bond site and a passivation layer, wherein the bond site is accessible through an aperture in the passivation layer;
   at least two ball bumps, wherein a first ball bump of the at least two ball bumps is bonded to the bond site, and each additional ball bump of the at least two ball bumps is bonded on a previously bonded ball bump so that a height of the at least two ball bumps is greater than a thickness of the passivation layer above the bond site; and
   a ball bond, bonded to an uppermost ball bump of the at least two ball bumps, and having a wire formed integrally therewith.

2. The integrated circuit of claim 1, wherein the at least two ball bumps comprise at least two different widest cross-sectional diameters in planes parallel to a surface of the bond site.

3. The integrated circuit of claim 1, wherein the bond site comprises a first bond site and the wire terminates at a second bond site.

4. The integrated circuit of claim 1, further comprising an integrated circuit package, wherein the circuit element is one of a plurality of circuit elements disposed within the integrated circuit package.

5. The integrated circuit of claim 1, wherein the wire has a diameter of at least approximately 50 microns.

6. The integrated circuit of claim 1, wherein widest cross-sectional diameters in planes parallel to a surface of the bond site vary from the first ball bump to the uppermost ball bump as distance above the bond site increases.

7. The integrated circuit of claim 6, wherein the widest cross-sectional diameters increase from the first ball bump to the uppermost ball bump as distance above the bond site increases.

8. The integrated circuit of claim 6, wherein the widest cross-sectional diameter of the ball bond is smaller than the widest cross-sectional diameter of the uppermost ball bump.

9. The integrated circuit of claim 6, wherein the widest cross-sectional diameter of the ball bond is larger than the widest cross-sectional diameters of each of the at least two ball bumps.

10. The integrated circuit of claim 1, wherein the ball bond does not contact the passivation layer.

11. The integrated circuit of claim 1, wherein the passivation layer partially overlaps the bond site.

12. The integrated circuit of claim 1, wherein the at least two ball bumps do not contact the passivation layer.

13. An integrated circuit comprising:
at least one circuit element comprising at least one bond site and a passivation layer, wherein the bond site is accessible through an aperture in the passivation layer;
at least one ball bump, wherein the at least one ball bump is bonded to the bond site so that a height of the at least one ball bump is greater than a thickness of the passivation layer above the bond site; and
a ball bond, bonded to the at least one ball bump, and having a wire formed integrally therewith.

14. An integrated circuit comprising:
at least one circuit element comprising at least one bond site;
at least two ball bumps, wherein a first ball bump of the at least two ball bumps is bonded to the bond site, each additional ball bump of the at least two ball bumps is bonded on a previously bonded ball bump and widest cross-sectional diameters of the at least two ball bumps in planes parallel to a surface of the bond site increase from the first ball bump to an uppermost ball bump above the bond site; and
a ball bond, bonded to the uppermost ball bump of the at least two ball bumps, and having a wire formed integrally therewith.

15. A method for performing a wire-bonding operation in an integrated circuit, utilizing a bonding tool, the method comprising the steps of:
bonding a first ball bump of at least two ball bumps to a bond site in the integrated circuit;
bonding each additional ball bump of the at least two ball bumps on a previously bonded ball bump so that a height of the at least two ball bumps is greater than a thickness of a passivation layer above the bond site; and
forming a ball bond, having a wire integral therewith, on an uppermost ball bump of the at least two ball bumps.

16. The method of claim 15, wherein the step of bonding a first ball bump to a bond site further comprises the step of forming a first ball with a wire having a diameter between approximately 12 and 50 microns.

17. The method of claim 15, wherein the step of forming a ball bond comprises ball bonding a wire to the uppermost ball bump of the at least two ball bumps.

18. The method of claim 15, wherein in the step of forming a ball bond, the wire has a diameter of at least approximately 50 microns.

19. The method of claim 15, further comprising the step of terminating the wire at a second bond site, thereby creating a wire bond profile.

20. The method of claim 19, further comprising the step of repeating the steps of bonding a first ball bump, bonding each additional ball bump, forming a ball bond, and terminating the wire, for a plurality of wire bonds of the integrated circuit.

21. Apparatus for performing a wire-bonding operation in an integrated circuit, the apparatus comprising:
a bonding tool;
a memory; and
at least one processor, coupled to the memory, and operative to control the bonding tool to perform the steps of: (i) bonding a first ball bump of at least two ball bumps to a bond site in the integrated circuit; (ii) bonding each additional ball bump of the at least two ball bumps to a previously bonded ball bump so that a height of the at least two ball bumps is greater than a thickness of a passivation layer above the bond site; and (iii) forming a ball bond, having a wire integral therewith, on an uppermost ball bump of the at least two ball bumps.

22. An article of manufacture for performing a wire-bonding operation in an integrated circuit, utilizing a bonding tool, comprising a machine readable medium containing one or more programs which when executed implement the steps of:
bonding a first ball bump of at least two ball bumps to a bond site in the integrated circuit;
bonding each additional ball bump of the at least two ball bumps to a previously bonded ball bump so that a height of the at least two ball bumps is greater than a thickness of a passivation layer above the bond site; and
forming a ball bond, having a wire integral therewith, on an uppermost ball bump of the at least two ball bumps.

* * * * *